United States Patent [19]

Coughlin, Jr. et al.

[11] Patent Number: 6,127,867
[45] Date of Patent: Oct. 3, 2000

[54] ZERO SET-UP HIGH SPEED CMOS LATCHED-RECEIVER

[75] Inventors: Terry Cain Coughlin, Jr., Johnson City; William Fredrick Lawson, Vestal, both of N.Y.

[73] Assignee: International Business Machines Corporation, Armonk, N.Y.

[21] Appl. No.: 09/181,399

[22] Filed: Oct. 28, 1998

[51] Int. Cl.[7] ................................................ H03K 3/289
[52] U.S. Cl. .......................................... 327/202; 327/218
[58] Field of Search .................................. 327/202, 203, 327/209, 210, 211, 212, 218

[56] References Cited

U.S. PATENT DOCUMENTS

| | | | |
|---|---|---|---|
| 4,808,840 | 2/1989 | Chung et al. | 327/206 |
| 5,097,157 | 3/1992 | Jaffe et al. | 327/55 |
| 5,107,153 | 4/1992 | Osaki et al. | 327/288 |
| 5,117,124 | 5/1992 | Dicke | 327/212 |
| 5,170,074 | 12/1992 | Aoki | 327/203 |
| 5,654,653 | 8/1997 | Coyle et al. | 327/51 |
| 5,663,669 | 9/1997 | Vanderschaaf | 327/201 |
| 5,668,490 | 9/1997 | Mitra et al. | 327/203 |
| 5,982,211 | 11/1999 | Ko | 327/202 |

FOREIGN PATENT DOCUMENTS 4-258012  9/1992  Japan ...................................... 327/203

*Primary Examiner*—Terry D. Cunningham
*Assistant Examiner*—Quan Tra
*Attorney, Agent, or Firm*—Scully, Scott, Murphy & Presser; John R. Pivnichny

[57] ABSTRACT

A latched receiver circuit capable of receiving data and clock simultaneously. New data is latched at every clock cycle without delay or buffering of the data or the clock. The latched receiver may also receive and latch small signals without the aid of a receiver preamp or added delay.

10 Claims, 2 Drawing Sheets

ZERO SET-UP HIGH SPEED CMOS LATCHED-RECEIVER

BACKGROUND OF THE INVENTION

1. Field of the Invention

The present invention relates generally to the field of buffering and latching of data input to high-speed digital circuits and systems, and more particularly, to a latched receiver circuit enabling simultaneous receipt of clock and data signals without any delay or buffering of the data or clock signal.

2. Discussion of the Prior Art

The transfer of data between integrated circuits such as high-speed digital circuits may be broken down to a timing budget in the overall system architecture. When data is received by an integrated circuit, it is typically buffered and latched and only after buffering and latching is the data considered successfully captured. In high speed digital circuits, the faster the data can be latched, the faster or, in some cases, the further data can be transmitted.

During digital circuit input operations, data enters the integrated circuit through an off-chip receiver and the data signal is buffered and fed to a latch. Typically, the data is captured by the latch on an edge or level of a system clock. To optimize this process, various input circuit implementations have been devised to minimize the delay through the buffer and setup time of the latch. For example, design and placement of input buffer and latch circuit components may minimize this time, but, currently result in some portion of the overall timing budget.

Various high-speed input latch/receiver devices having "low" set-up times may be found in U.S. Pat. No. 4,808,840 (edge-triggered latch), U.S. Pat. No. 5,097,157 (bus-receiver), U.S. Pat. Nos. 5,107,153, 5,117,124 (high-speed input receiver latch), U.S. Pat. Nos. 5,654,653, and 5,663,669 (several-stage latch). Representative of these patent disclosures is U.S. Pat. No. 5,107,153 which describes a latch circuit that delays the signals to control setup time.

The ideal situation is to have zero delay through the input buffer and zero setup time for the latch. This results in a zero timing penalty for the data path if this is achieved without delaying the clock or data. For high speed digital I/O, the problem is further complicated due to the signal swing of the incoming signals. High performance I/O device technologies such as GTL or HSTL have voltage swings smaller than the IC's native voltage. This requires the input receiver to amplify the incoming signal before it is captured by the latch, adding further delay to the timing penalty. Above-mentioned U.S. Pat. No. 5,654,653 describes a system bus receiver of reduced set-up time by latching unamplified bus voltage.

It would be highly desirable to provide a latched-receiver circuit with a zero setup time, i.e., capable of receiving data and clock signals simultaneously without amplification of the data signal or clock signal delay.

SUMMARY OF THE INVENTION

It is thus an object of the invention to provide a latched-receiver circuit device having a zero setup time that is capable of latching data received simultaneously with a clock signal.

It is another object of the invention to provide a latched-receiver circuit device having a zero setup time that is achieved without any delay or buffering of the input data or clock.

It is a further object of the invention to provide a latched-receiver circuit device that is capable of receiving and latching small signals without the aid of a receiver preamp or added delay.

In accordance with the present invention, there is provided a zero set-up latched-receiver circuit for a digital input/output device comprising a first circuit for receiving input data signals and a clock signal, and latching the input data signals for output thereof, the data signal available for latching during a first transition of the clock signal, and latched at a second transition of a clock signal; and, a second circuit for receiving latched data output from the first circuit and a complemented clock signal, and passing the latched data to an output upon a first transition of the complemented clock signal, the second circuit latching the data at the output in response to a second transition of the complemented clock signal, wherein successive data signals may be input to the first circuit simultaneously with second transitions of successive clock signals for latched output at the second circuit.

Advantageously, the zero setup time latched receiver circuit of the invention may receive either full-swing logic levels, analog levels or high speed logic levels that are less than the circuit's native voltage, without the need of a receiver pre-amp or added delay. Furthermore, zero setup time latched receiver circuit may be implemented either as an edge triggered or level sensitive latch, or, may be implemented as either a single ended or differential latched-receiver.

BRIEF DESCRIPTION OF THE DRAWINGS

Further features and advantages of the invention will become more readily apparent from a consideration of the following detailed description set forth with reference to the accompanying drawings, which specify and show preferred embodiments of the invention, wherein like elements are designated by identical references throughout the drawings; and in which.

DETAILED DESCRIPTION OF THE INVENTION

Figure 1:
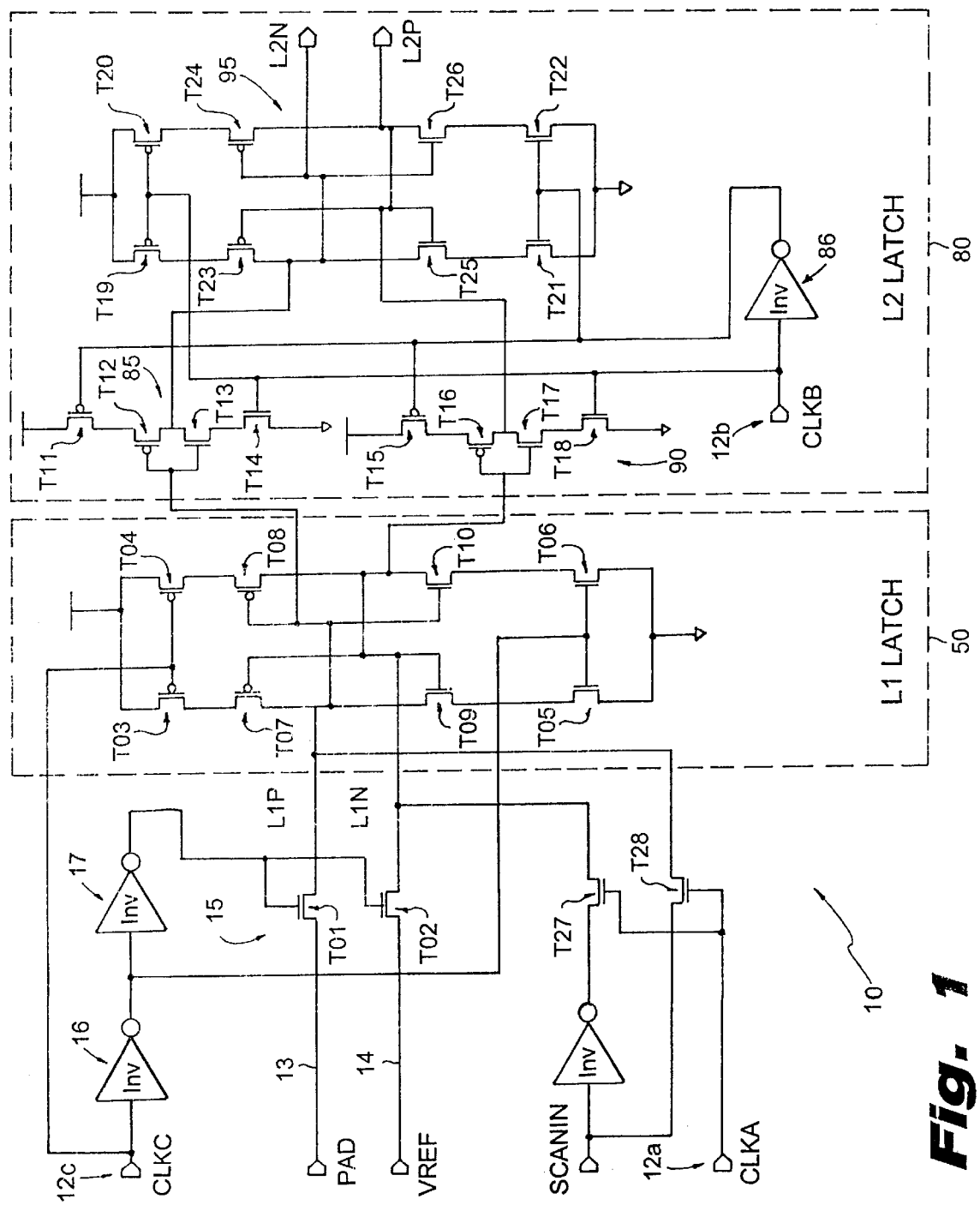
FIG. 1 illustrates one implementation of the latched-receiver circuit of the invention.

FIG. 1 is a circuit diagram of one implementation of the latched-receiver circuit 10 of the invention. As shown in the circuit diagram of FIG. 1, the latched-receiver circuit 10 includes: a pass gate structure 15, a first latch circuit structure 50, and a second latch circuit structure 80. The pass gate structure 15 is shown comprising two NFET transistors T01 and T02, with a terminal of T01 receiving a PAD data input 13, and a terminal of T02 receiving a VREF 14 voltage reference input which, in the case of a single-ended receiver, is typically a common-mode voltage, e.g., $V_{DD}/2$, and, in the case of differential receiver, is a PAD complement signal. Additionally shown are three clock inputs 12a, 12b and 12c for receiving respective clock inputs labeled clkA, clkB, and, clkC in FIG. 1. As will be described in greater detail hereinafter, clkB and clkC are of the same frequency but oppositely phased and non-overlapping, i.e., the falling edge of clkB occurs at or before the rising edge of clkC, as shown in the timing diagram of FIG. 2.

Further as shown in FIG. 1, L1 latch circuit 50 is a cross-coupled structure including transistors T03–T06 each functioning to enable data from the PAD receiver input 13 to charge each of respective latch input transistors T07–T10. In the preferred embodiment, as an initial condition, the clkC 12c input is high, turning on the pass gates T01 and T02 and turning off the L1 latch structure transistors T03–T06. This condition enables data from the PAD receiver input 13 to charge the respective latch input transistors T07–T10. That is, as the clkC is '1' or high at this initial condition, the gates of latches T03 and T04 are not biased. Inverter device 16 receiving clkC provides a '0' or low at active low gates of transistors T05–T06, thus turning these devices off in the initial condition. Because these transistors are oppositely biased, there are no opposing currents and the load is very small (i.e., fast), in this initial condition. Preferably, a small differential voltage is established between the PAD 13 and VREF 14 at the input to the cross coupled L1 latch structure T07–T10. This is illustrated in the FIG. 2 as a voltage differential of about 100 mV (millivolts) between the L1P voltage (shown as approximately 0.95V) and the L1N input (shown as approximately 1.05V) and represents the state of the single ended receiver, prior to the falling edge of the clkC. In the case of the single ended receiver, the PAD input voltage swings about the VREF common-mode input voltage may range from millivolts, e.g., 100 mV, to full rail. It should be understood that the zero setup time latch receiver circuit may be implemented as either a single ended or differential latched-receiver.

Additionally, in this initial condition, at the same time clkC is high, clkB is low, thus de-activating latch L2 transistors T11, T14, T15 and T18. Particularly, when clkB is low, the input to the L2 latch circuit structure 80 is off, i.e., transistor gates T18 and T14 are off. Inverter device 86 receiving clkB provides a '1' or high at active low gates of transistors T11 and T15, thus turning these devices off in the initial condition. Because these transistors are oppositely biased, there are no opposing currents and the load presented to the output of the L1 latch structure is very low.

Figure 2:
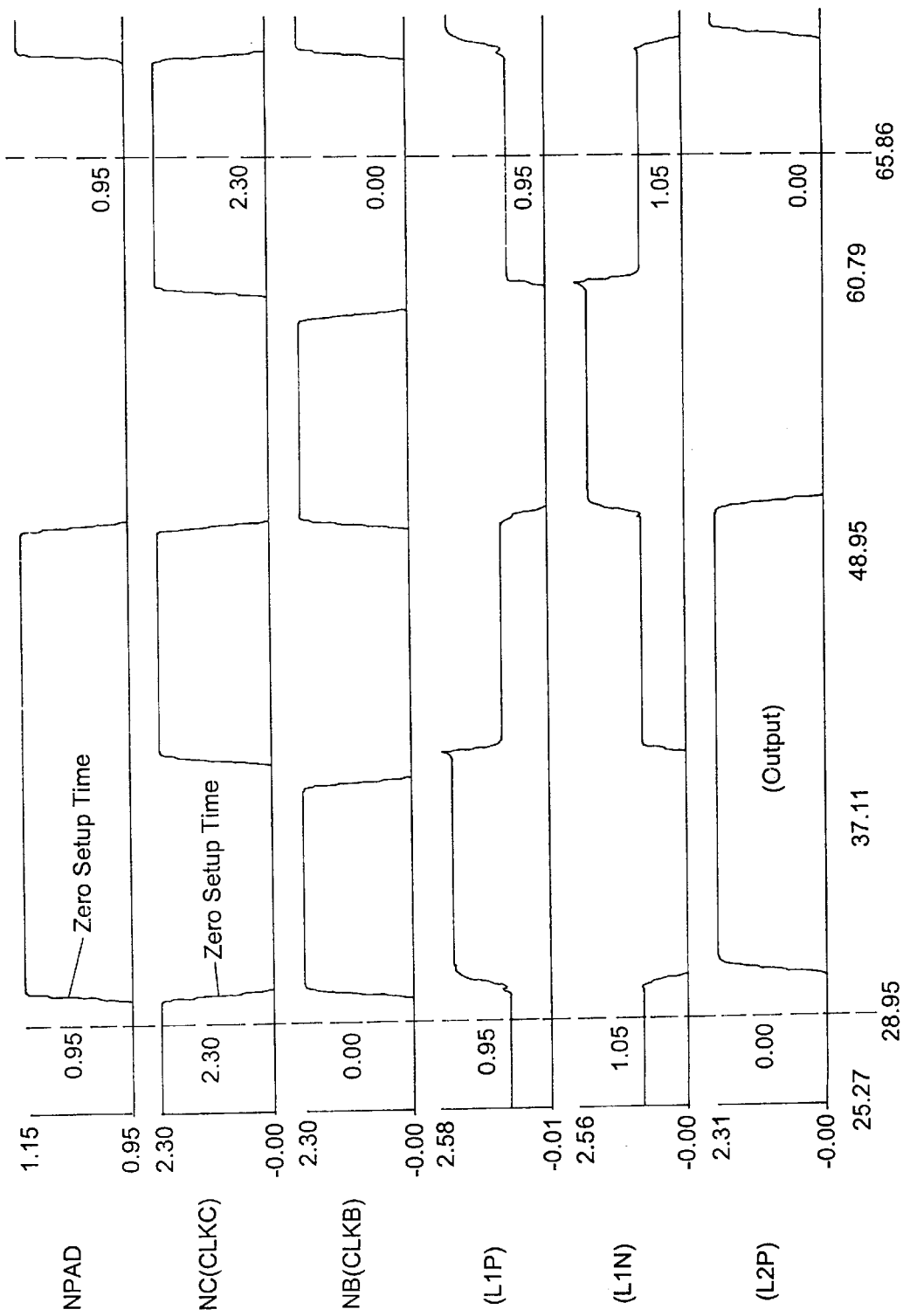
FIG. 2 illustrates a signal timing diagram relating to the latched-receiver circuit of the invention.

The condition of latching data in latch circuit 50 at the PAD receiver input 13 occurs when CLKC signal 12c falls. Because the L1 latch requires such a small differential voltage at its input and is very lightly loaded, the data at PAD may rise or fall at the same time clkC falls. When clkC falls, transistors T03 and T04 are immediately turned on. Transistors T05 and T06 turn on next to power up the L1 latch. When this happens, the small differential voltage (e.g., 100 mV between the PAD and VREF as shown in FIG. 2) is brought to full rail voltage by the cross-coupled L1 latch. After the delay of inverter devices 16 and 17, the input pass gates are shut off (T01 and T02) to prevent the L1 latch from changing its state should the voltage at PAD change. Input data is now latched at nodes L1N and L1P.

Referring to the signal timing diagram of FIG. 2, at the same time clkc signal 12c falls (or after clkC falls), clkB signal 12b rises, thus turning on transistors T14, T18 and turning off transistors T19 and T20 in latch L2 circuit. Simultaneously, transistors T11, T15 are turned on and T21 and T22 are turned off by clkB complement provided at the output of the inverter 86. Turning on transistors T11, T14 at the clkB rising edge enables current to flow through cascaded transistors T12 and T13 of inverter 85 thus functioning to invert the L1P data output from the L1 latch circuit 50 and feed the inverted L1P data to the cross-coupled latch circuit 95 comprising transistors T23–T26 for latching at the L2P output of latch 80. For example, when L1P is at full rail voltage (e.g., as shown in FIG. 2) at the input to inverter 85, transistor T13 turns on bringing the output (labeled L2N) to ground. Likewise, turning on transistors T15, T18 enables current to flow through cascaded transistors T16 and T17 of inverter 90 which inverts the L1N data output from the L1 Latch 50 and feeds the inverted L1N data to the cross-coupled latch circuit 95 for latching at the L2N output of latch 80.

For example, when L1N is at zero volts (e.g., as shown in FIG. 2) at the input to inverter 90, transistor T16 turns on bringing the output (labeled L2P) to full rail voltage equal to VDD, e.g., about 2.5 volts as shown in FIG. 2. Thus, it is understood that L1P and L1N data inputs of latch 50 are gate isolated from the latch 80 outputs by respective transistor pairs T12, T13, and T16 and T17. This enables the L2 latch 80 outputs to latch without disturbing the L1 inputs or outputs.

Finally, when clkB signal 12b falls, differential voltage results, i.e., L1N and L1P data, are latched to respective outputs L2N and L2P of L2 latch circuit 80. At the same time, transistors T11, T14, T15 and T18 turn off, preventing any new data from the L1 outputs from feeding the L2 inputs (L2N and L2P).

An example timing diagram of the latched receiver circuit 10 exhibiting zero setup time is shown in FIG. 2. As shown in FIG. 2, at the falling edge of clkC signal 12c, coinciding with the rising edge of clkB signal 12b, any data present at the PAD 13 and Vref 14 inputs are latched at the L2P (and L2N) outputs, as shown. Zero setup time is exhibited as latch 50 grabs the input data present at the input latch circuit 50 data immediately, without any delay or hold. Thus, data information at the latched receiver circuit 10 may arrive at the same time as the clock edge, without the need for delaying the clock, resulting in improved bandwidth when integrated in high speed digital I/O circuits. It should be understood that one skilled in the art may be able to modify the zero setup time latched receiver circuit design of FIG. 1 to produce a level sensitive latch, rather than edge triggered as exemplified in FIG. 1.

The latched receiver circuit 10 of the invention may also be used as a fully scannable latch. As shown in FIG. 1, inverter 23, test clkA test signal 12a and transistors T27 and T28 are used to scan data into the L1 latch, enabling full compatibility with LSSD (Level Sensitive Scan Design) test strategy. Thus, the invention may be used as a stand alone LSSD latch with zero setup time.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

We claim:

1. A zero set-up latched-receiver circuit for a digital input/output device comprising:

a first latch circuit including pass-gate input devices for receiving input data signals and providing gated input data input signals, both said first latch circuit and said pass-gate devices operable under control of a clock signal, said gated input data signals available for latching at a clock signal state at and prior to a first transition of said clock signal and latched by said first latch circuit at said first clock transition; and, delay circuit for delaying transition of said clock at said pass-gate input devices for preventing input of data signals from the pass-gate input devices to said first latch immediately after latching at said first clock transition, wherein said input data signals include differential analog input voltages that rise or fall at the same time of each first clock transition and successive fist clock signal transitions.

2. The zero set-up latched-receiver circuit as claimed in claim 1, wherein said first latch circuit comprises a cross-coupled latch circuit for latching said differential voltage inputs.

3. The zero set-up latched-receiver circuit as claimed in claim 1, further comprising a second latch circuit for receiving latched data output from said first latch circuit and a complemented clock signal, and passing said latched data to second latch circuit output at a first transition of said complemented clock signal and latching said data at said second latch circuit output in response to a second transition of said complemented clock signal.

4. The zero set-up latched-receiver circuit as claimed in claim 1, wherein said differential analog input voltages are in the millivolt range.

5. The zero set-up latched-receiver circuit as claimed in claim 1, wherein said delay circuit for delaying transition of said clock at said pass-gate input devices includes an inverter device for receiving said clock signal, said delay comprising a propagation time of said clock signal through said inverter device.

6. The zero set-up latched-receiver circuit as claimed in claim 3, wherein said second latch circuit includes isolating circuit connected to said first latch circuit output for receiving said latched input data signal output from said first latch circuit and passing said data to said second latch circuit output, said isolating circuit further preventing any new data at said first latch circuit output from passing to said second latch circuit output in response to said second transition of said complemented clock signal, whereby outputs of said second latch circuit may be latched without disturbing signal inputs to or outputs from said first latch circuit.

7. The zero set-up latched-receiver circuit as claimed in claim 6, wherein said isolating circuit includes one or more transistor devices having gate terminals, said latched input data signal output from said first latch circuit being input to said gate terminals of said devices for providing isolation from outputs of said second latch circuit.

8. The zero set-up latched-receiver circuit as claimed in claim 6, wherein said one or more transistor devices of said isolating circuit functions to invert an output of said first latch circuit.

9. The zero set-up latched-receiver circuit as claimed in claim 3, wherein said first latch and second latch circuits are edge triggered, said first second transitions corresponding to an edge of said clock and complemented clock signals.

10. The zero set-up latched-receiver circuit as claimed in claim 3, wherein said first latch and second latch circuits are level sensitive, said first and second transitions corresponding to a logic level of said clock and complemented clock signals.

* * * * *

UNITED STATES PATENT AND TRADEMARK OFFICE
CERTIFICATE OF CORRECTION

PATENT NO. : 6,127,867
DATED : October 3, 2000
INVENTOR(S) : T. C. Coughlin, Jr. et al.

It is certified that error appears in the above-identified patent and that said Letters Patent is hereby corrected as shown below:

Column 3,
Line 52, "clkc" should read -- clkC --

Column 4,
Line 59, "state at and" should read -- state and --

Column 5,
Line 2, "fist" should read -- first --

Signed and Sealed this

Ninth Day of November, 2004

JON W. DUDAS
*Director of the United States Patent and Trademark Office*